(12) United States Patent
Torashima et al.

(10) Patent No.: US 8,980,670 B2
(45) Date of Patent: Mar. 17, 2015

(54) ELECTROMECHANICAL TRANSDUCER AND METHOD OF MANUFACTURING THE SAME

(71) Applicant: Canon Kabushiki Kaisha, Tokyo (JP)

(72) Inventors: Kazutoshi Torashima, Yokohama (JP); Takahiro Akiyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/146,853

(22) Filed: Jan. 3, 2014

(65) Prior Publication Data

US 2014/0120646 A1    May 1, 2014

Related U.S. Application Data

(62) Division of application No. 13/248,440, filed on Sep. 29, 2011, now Pat. No. 8,653,613.

(30) Foreign Application Priority Data

Oct. 15, 2010 (JP) .................................. 2010-232046

(51) Int. Cl.
*H01L 21/00* (2006.01)
*B81C 1/00* (2006.01)
*B06B 1/02* (2006.01)

(52) U.S. Cl.
CPC ........... *B81C 1/00158* (2013.01); *B06B 1/0292* (2013.01)
USPC ....... 438/52; 257/415; 257/E21.597; 367/163

(58) Field of Classification Search
CPC .............. B06B 1/0292; B81C 1/00301; H01L 21/76898
USPC .............. 257/415, E21.597; 438/52; 367/163
See application file for complete search history.

(56) References Cited

U.S. PATENT DOCUMENTS

| 6,110,825 | A | 8/2000 | Mastromatteo et al. |
| 6,225,651 | B1 | 5/2001 | Billon |
| 6,836,020 | B2 * | 12/2004 | Cheng et al. ................... 257/774 |
| 2004/0085858 | A1 * | 5/2004 | Khuri-Yakub et al. ........ 367/181 |
| 2004/0214380 | A1 * | 10/2004 | Leib et al. ...................... 438/151 |
| 2005/0104204 | A1 * | 5/2005 | Kawakubo et al. ............ 257/724 |
| 2007/0099395 | A1 * | 5/2007 | Sridhar et al. ................. 438/460 |

(Continued)

FOREIGN PATENT DOCUMENTS

| JP | 2006-516368 A | 6/2006 |
| WO | 2005/120130 A | 12/2005 |
| WO | WO 2009151089 A1 * | 12/2009 |

*Primary Examiner* — Steven J Fulk
(74) *Attorney, Agent, or Firm* — Canon USA, Inc. IP Division

(57) ABSTRACT

An electromechanical transducer includes multiple elements each including at least one cellular structure, the cellular structure including: a semiconductor substrate, a semiconductor diaphragm, and a supporting portion for supporting the diaphragm so that a gap is formed between one surface of the substrate and the diaphragm. The elements are separated from one another at separating locations of a semiconductor film including the diaphragm. Each of the elements includes in a through hole passing through a first insulating layer including the supporting portion and the semiconductor substrate: a conductor which is connected to the semiconductor film including the diaphragm; and a second insulating layer for insulating the conductor from the semiconductor substrate.

20 Claims, 4 Drawing Sheets

(56) References Cited

U.S. PATENT DOCUMENTS

| | | | |
|---|---|---|---|
| 2007/0164632 A1* | 7/2007 | Adachi et al. | 310/311 |
| 2007/0264732 A1 | 11/2007 | Chen | |
| 2010/0259127 A1* | 10/2010 | Zaitsu et al. | 310/300 |
| 2012/0119311 A1* | 5/2012 | Akhlaghi Esfahany et al. | 257/415 |

* cited by examiner

ELECTROMECHANICAL TRANSDUCER AND METHOD OF MANUFACTURING THE SAME

CROSS-REFERENCE TO RELATED APPLICATION

This application is a Divisional of U.S. application Ser. No. 13/248440, filed Sep. 29, 2011, which claims priority from Japanese Patent Application No. 2010-232046, filed Oct. 15, 2010, which are hereby incorporated by reference herein in their entireties.

BACKGROUND OF THE INVENTION

1. Field of the Invention

The present invention relates to an electromechanical transducer such as a capacitive transducer array, and to a method of manufacturing the electromechanical transducer.

2. Description of the Related Art

Conventionally, micromechanical members to be manufactured using micromachining technology may be processed on the order of micrometers, and various functional microelements are materialized using such micromechanical members. A capacitive transducer using such technology (CMUT: capacitive micromachined ultrasonic transducer) is being studied as an alternative to a piezoelectric element. With such a CMUT, ultrasound may be transmitted and received using vibrations of a diaphragm, and in particular, excellent wideband characteristics in a liquid can be obtained with ease.

With regard to the above-mentioned technology, there is a capacitive transducer array in which a silicon nitride film is formed on a substrate and used as a diaphragm and one of an electrode on the diaphragm and an electrode formed on the substrate is routed to a lower surface of the substrate (Japanese Patent No. 3,924,466). Further, there is a capacitive transducer array which uses a monocrystalline silicon diaphragm formed on a silicon substrate by bonding or the like (US 2008/0048211). In the configuration of the latter, a silicon film including the monocrystalline silicon diaphragm functions as a common electrode. The silicon substrate is divided and the divided silicon substrate is used as a signal take-out electrode, to thereby form the capacitive transducer array. Further, in order to improve the device stiffness, a frame structure is formed around the signal take-out electrode.

In the capacitive transducer array in which the monocrystalline silicon diaphragm is formed on the silicon substrate by bonding or the like, the silicon substrate may be divided and used as a signal take-out electrode. However, since the silicon substrate is divided, the stiffness of the transducer array is lowered and the transducer array may be broken by thermal stress in mounting or the like.

Further, an electrical signal from the electrode of the diaphragm may be taken out to a rear surface of the silicon substrate via through wiring. However, in forming the through wiring, an insulating material or a through wiring material for taking out an electrical signal to the rear surface may deposit on the diaphragm. Further, when thermally oxidizing a through hole, the monocrystalline silicon diaphragm may also be oxidized. This may cause thickness fluctuations in the diaphragm or generate stress thereon. Further, when polysilicon is used as a conductor for the wiring, the polysilicon may also deposit on the monocrystalline silicon diaphragm, which may result in thickness fluctuations in the diaphragm and stress on the diaphragm. Such thickness fluctuations in the diaphragm and stress thereon causes spring constant fluctuations and deformation fluctuations in the diaphragm. It may lead to lower consistency among elements in which transducer cells are included, and performance fluctuations among the elements in the capacitive transducer array may be increased.

SUMMARY OF THE INVENTION

An electromechanical transducer according to the present invention includes multiple elements each including at least one cellular structure, the cellular structure including: a semiconductor substrate; a semiconductor diaphragm; and a supporting portion for supporting the semiconductor diaphragm so that a gap is formed between one surface of the semiconductor substrate and the semiconductor diaphragm. The multiple elements are separated from one another at separating locations of a semiconductor film including the semiconductor diaphragm. Further, each of the multiple elements includes in a through hole passing through a first insulating layer including the supporting portion and the semiconductor substrate: a conductor which is connected to the semiconductor film; and a second insulating layer for insulating the conductor from the semiconductor substrate.

A method of manufacturing an electromechanical transducer according to a first aspect of the present invention includes: forming a first insulating layer on one surface of a first semiconductor substrate and forming a gap in the first insulating layer; bonding a second semiconductor substrate to the first insulating layer; thinning the second semiconductor substrate to form a semiconductor film; forming a through hole in the first semiconductor substrate, the first insulating layer, and the semiconductor film; forming a second insulating layer on a side wall of the through hole; forming a conductor on the second insulating layer; and dividing the semiconductor film at separating locations to form multiple elements, in which, before the forming a second insulating layer, a protective film is formed on the semiconductor film.

A method of manufacturing an electromechanical transducer according to a second aspect of the present invention includes: forming a first insulating layer on one surface of a first semiconductor substrate and forming a gap in the first insulating layer; bonding a second semiconductor substrate to the first insulating layer; forming a through hole in the first semiconductor substrate; forming a second insulating layer on a side wall of the through hole; forming a conductor on the second insulating layer; thinning the second semiconductor substrate to form a semiconductor film; and dividing the semiconductor film at separating locations to form multiple elements, in which, before the bonding a second semiconductor substrate, the through hole and the second insulating layer are formed, and, after the bonding a second semiconductor substrate, the conductor is formed.

According to the present invention, the electromechanical transducer has a configuration that the through wiring for electrical connection to the semiconductor film including the diaphragm is taken out to the opposite side of the semiconductor substrate, and the substrate is not divided, and thus, the lowering of the stiffness of the transducer is prevented.

The electromechanical transducer having such a configuration may be manufactured by the manufacturing method according to the present invention described above, in which a semiconductor material such as monocrystalline silicon having small thickness fluctuations and having small residual stress is used as a main material of a diaphragm, and the diaphragm is formed on one surface side of the semiconductor substrate. Thus, spring constant fluctuations and deformation fluctuations in the diaphragm can be reduced, and an electromechanical transducer having high consistency among elements and having reduced transmission and reception performance fluctuations may be provided.

Further, in the method of manufacturing an electromechanical transducer according to the first aspect of the present invention, a through wiring for electrical connection to a semiconductor film including the diaphragm is formed. Thus, an electromechanical transducer with high stiffness can be easily manufactured. Further, since a protective film is formed on the semiconductor film including the diaphragm before an insulating layer is formed in a through hole, the diaphragm is not exposed outward when the through wiring is formed, and an insulating layer material may be prevented from depositing directly on the diaphragm. Thus, since the spring constant fluctuations and the deformation fluctuations in the diaphragm may be reduced, and, an electromechanical transducer having high performance consistency can be provided. Here, when polysilicon or the like is used as a conductor material for the wiring, in order to prevent the conductor material from depositing on the diaphragm, the diaphragm may preferably be protected by a protective film also when the conductor is formed on the insulating layer in the through hole.

Further, according to the method of manufacturing an electromechanical transducer according to the second aspect of the present invention, a through wiring for electrical connection to the rear surface of a semiconductor film including the diaphragm is formed. Thus, an electromechanical transducer having high stiffness can be easily manufactured. Further, since the diaphragm is not exposed when the through wiring is formed, an insulating layer material and a conductor material used in forming the through wiring may be prevented from depositing directly on the diaphragm. Thus, the spring constant fluctuations and the deformation fluctuations in the diaphragm may be reduced. Further, since no through hole is formed in the front surface of the electromechanical transducer, the liquid may be prevented from entering the rear surface of the electromechanical transducer when the electromechanical transducer is used in a liquid.

Further features of the present invention will become apparent from the following description of exemplary embodiments with reference to the attached drawings.

DESCRIPTION OF THE EMBODIMENTS

In an electromechanical transducer according to the present invention, multiple elements are electrically separated from one another by dividing a semiconductor film including a diaphragm. The respective elements include through wiring for electrical connection to the respective semiconductor films. The through wiring is taken out to a rear surface side of a substrate which is a common electrode. Therefore, it is not necessary to divide the substrate correspondingly to the respective elements, and thus, the mechanical strength of the transducer can be maintained. Further, in first and second methods of manufacturing an electromechanical transducer according to the present invention, since an insulating layer constituting the through wiring is not formed while the semiconductor film which is to be the diaphragm is exposed, an insulating layer material is prevented from depositing directly on the diaphragm. Based on the above-mentioned idea, the electromechanical transducer and the manufacturing method therefor according to the present invention have basic configurations described in "SUMMARY OF THE INVENTION" above.

Figure 1A:
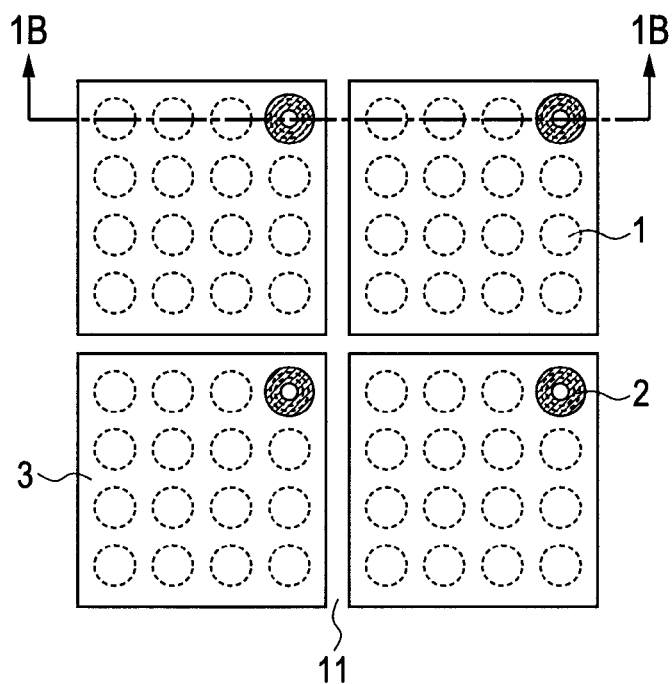
FIG. 1A is a top view illustrating a capacitive transducer array which is an electromechanical transducer of the present invention, according to an embodiment and Example 1.
Figure 1B:
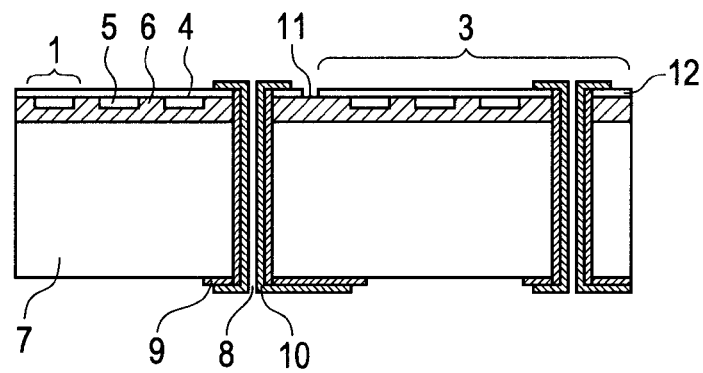
FIG. 1B is a sectional view illustrating the capacitive transducer array which is an electromechanical transducer of the present invention, according to the embodiment and Example 1.
Figure 1C:
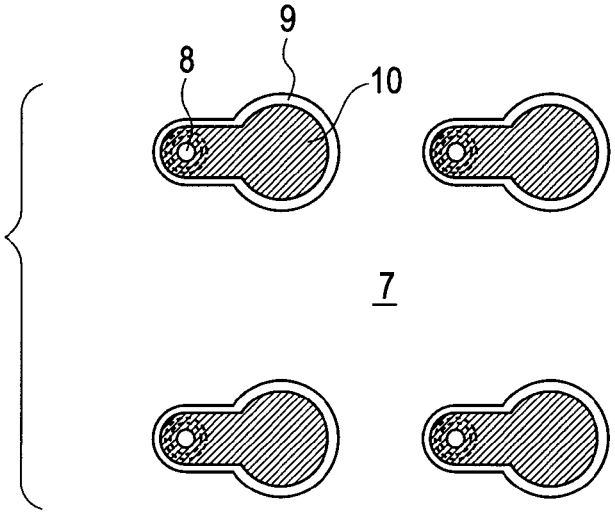
FIG. 1C is a bottom view illustrating the capacitive transducer array which is an electromechanical transducer of the present invention, according to the embodiment and Example 1.

In the following, an embodiment of the present invention is described with reference to FIGS. 1A, 1B, and 1C. FIG. 1A is a top view of a capacitive transducer array according to an embodiment of the electromechanical transducer of the present invention. FIG. 1B is a cross-sectional view taken along the line 1B-1B' of FIG. 1A. FIG. 1C is a bottom view thereof according to this embodiment. The capacitive transducer array of this embodiment includes multiple elements 3 each including multiple cellular structures 1 and through wiring 2. Although, In FIG. 1A, only four of the elements 3 are illustrated, arbitrary number of the elements 3 may be arranged. Further, although each of the elements 3 includes fifteen cellular structures 1 in the figure, similarly, arbitrary number of the cellular structures may be arranged, as far as at least one cellular structure 1 is included in each of the elements 3.

The cellular structure 1 includes a monocrystalline silicon diaphragm 4 which is a semiconductor diaphragm, a gap 5, a diaphragm supporting portion 6 for supporting the monocrystalline silicon diaphragm 4, and a silicon substrate 7 which is a semiconductor substrate. The monocrystalline silicon diaphragm 4 has almost no residual stress, smaller fluctuations in thickness, and smaller fluctuations in diaphragm spring constant as compared to a diaphragm formed by lamination (for example, silicon nitride film). Therefore, performance fluctuations among the elements and among the cellular structures are small. As the diaphragm supporting portion 6, an insulator such as silicon oxide or silicon nitride is desirably used. When the diaphragm supporting portion 6 is not an insulator, it is necessary to form an insulating layer on the silicon substrate 7 in order to insulate the monocrystalline silicon diaphragm 4 from the silicon substrate 7. Since, as described below, the silicon substrate 7 is used as a common electrode for multiple elements 3, it is desired that the silicon substrate 7 be a low resistance substrate which promotes ohmic behavior. It is desired that the resistivity be 0.1 Ω·cm or lower. Note that, "ohmic" means that the resistance value is constant irrespective of the direction of current and the amount of voltage.

The through wiring 2 includes a through hole 8, a conductor 10 (functions as a wiring), and an insulating layer 9 for insulating the conductor 10 from the silicon substrate 7. The through hole 8 passes through a first insulating layer including the diaphragm supporting portion 6 and the silicon substrate 7. In order to insulate the conductor 10 from the silicon substrate 7, the insulating layer 9 is required to be uniformly formed on the side wall of the through hole 8. Further, the capacitance between the silicon substrate 7 and the conductor 10 is a parasitic capacitance and becomes a noise source of the capacitive transducer. Thus, the insulating layer 9 may be formed as thick as possible to reduce the capacitance, which realizes improved transmission and reception performance. Therefore, as the insulating layer 9, silicon oxide formed by thermal oxidation or silicon oxide formed using a tetraethoxysilane (TEOS) film, which enables both a film thickness of 1 μm or larger and a uniform insulating layer, is desirable. Since the conductor 10 connects a silicon film 12, which is a semiconductor film including the monocrystalline silicon diaphragm 4, to a rear surface of the silicon substrate 7 via the through hole 8, a material which may be uniformly formed is desirable for the conductor 10. Therefore, polysilicon doped with impurities or the like is desirable. In the case of polysilicon, the resistivity thereof may be changed by changing the concentration of the impurities, and thus, the ohmic behavior is easily attained.

As described above, in order to electrically connect the silicon film 12 including the monocrystalline silicon diaphragm 4 to the rear surface of the silicon substrate 7 via the through hole 8, the through hole 8 is required to seamlessly extend at least from a rear surface of the silicon film 12 to the rear surface of the silicon substrate 7. Further, since a level difference in the through hole 8 would lead to a short circuit between the conductor 10 and the silicon substrate 7 or disconnection in the conductor 10, it is desirable that the side wall of the through hole 8 be shaped so as not to have a level difference therein. Further, the through hole 8 may be tapered so that the insulating layer 9 or the conductor 10 may be easily formed therein. In particular, by adopting the tapering structure in which the diameter of the through hole 8 on the silicon substrate 7 side at which the electrode is taken out is larger than the diameter thereof on the silicon film 12 side, the number of the cellular structures in an element can be increased and the transmission and reception sensitivity may be improved.

The multiple elements 3 are electrically separated from one another at separating locations (grooves) 11. Those electrically separating grooves can be formed by subjecting the silicon film 12 to etching at the separating locations 11. This configuration enables an electrical signal of each of the elements 3 in the capacitive transducer array to be taken out to the rear surface side.

The drive principle of this embodiment is now described. The multiple elements 3 are formed on the common silicon substrate 7 which may be used as the common electrode. The multiple elements 3 are electrically insulated from one another at the separating locations 11, and thus, respective electrical signals from the elements 3 may be separately taken out to the rear surface of the silicon substrate 7. When receiving ultrasound at the capacitive transducer array, a direct voltage is applied in advance to the silicon substrate 7 by a voltage applying unit (not shown). Then, when ultrasound is received, the monocrystalline silicon diaphragm 4 is deformed, which alters the amount of the gap 5 which is the distance between the monocrystalline silicon diaphragm 4 and the silicon substrate 7, to change the capacitance. This change in capacitance causes a current to flow through the conductor 10, which current, then, being converted into a voltage by a current-to-voltage converter (not shown), to thereby receive ultrasound. Besides, a direct voltage and an alternating voltage can be applied to the silicon substrate 7 to vibrate the monocrystalline silicon diaphragm 4 by electrostatic force, so that ultrasound may be transmitted therefrom.

In the capacitive transducer according to this embodiment, the silicon film 12 including the monocrystalline silicon diaphragm 4 is divided to electrically separate the elements 3 from one another, and the silicon substrate 7 is used as the common electrode. In this configuration, since the silicon substrate 7 is not divided by grooves or the like, the stiffness of the capacitive transducer array can be increased, and the capacitive transducer may be prevented from being broken even if stress is applied thereto when being mounted or the like. Further, compared to the case of a capacitive transducer using a diaphragm which is manufactured by lamination, for example, a silicon nitride film, the use of a monocrystalline silicon diaphragm facilitates film thickness control and reduces residual stress. Still Further, as described in description of manufacturing methods below, a material having large residual stress is not deposited on the monocrystalline silicon diaphragm 4, and the diaphragm 4 in which a main material is monocrystalline silicon having small residual stress may be obtained. Therefore, fluctuations in diaphragm spring constant and fluctuations in diaphragm deformation can be reduced, and thus, performance fluctuations among the cellular structures or among the elements 3 may be significantly reduced and the transmission and reception characteristics may be stabilized.

Further, as described in the description of the manufacturing methods below, since the capacitive transducer array may be manufactured by forming the diaphragm supporting portion 6 and the gap 5 and then bonding another substrate, fluctuations in the distance between the monocrystalline silicon diaphragm 4 and the silicon substrate 7 can be reduced.

Therefore, transmission and reception sensitivity fluctuations between the cellular structures and among the elements 3 may be reduced. Still Further, in this configuration, the silicon film 12 including the monocrystalline silicon diaphragm 4 is taken out to the rear surface via the vertical through wiring 2 having little level difference, to thereby prevent short circuit and disconnection due to level difference or the like caused when the insulating layer 9 or the conductor 10 forming the through wiring 2 is formed.

Further, as illustrated in FIG. 1C, the insulating layer 9 formed on the rear surface of the silicon substrate 7 is not required to be formed all over the rear surface, and may be divided. Therefore, deformation of the whole silicon substrate 7 due to stress produced by the insulating layer 9 may be prevented. If the whole silicon substrate 7 is deformed, it becomes difficult to bond the silicon film 12 forming the monocrystalline silicon diaphragm 4 to the silicon substrate 7, which may lead to a bonding failure. On the contrary, this configuration may reduce such bonding failure. Still further, deformation fluctuations among the elements 3 can also be reduced, and thus, fluctuations in the distance between an object to be measured and the element 3 may be reduced in the respective elements 3 in receiving ultrasound. Still further, fluctuations in focal position of ultrasound generated from the respective elements 3 in transmission can also be reduced.

Figure 2:
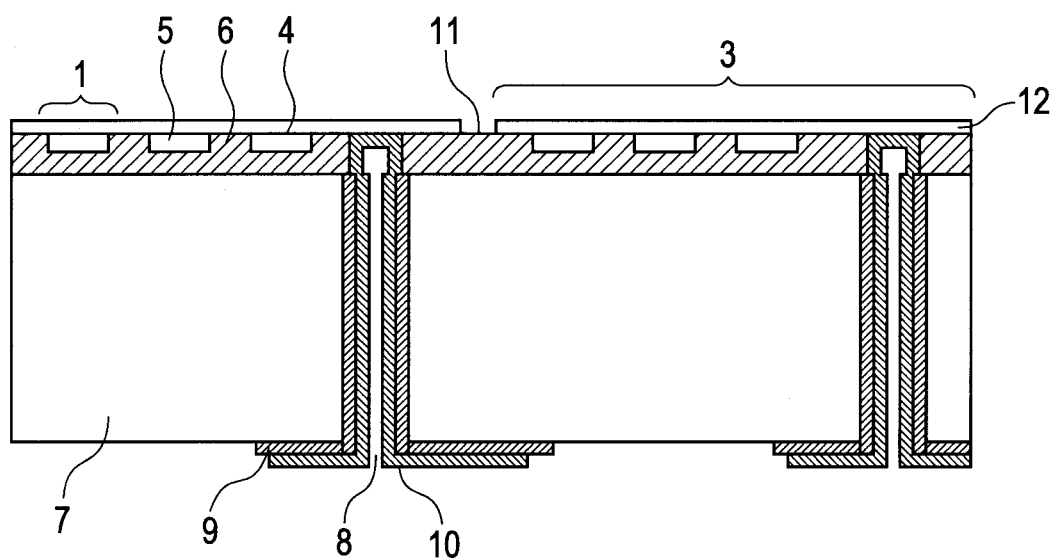
FIG. 2 is a cross-sectional view illustrating a capacitive transducer array which is an electromechanical transducer of the present invention, according to Example 2.

As described later, connection to the conductor 10 for the wiring may be made on the rear surface of the silicon film 12 including the monocrystalline silicon diaphragm 4 (see FIG. 2). In this configuration, a through hole is not formed on the diaphragm 4 side, and thus, even when the capacitive transducer array is used in a liquid or the like, the liquid may be prevented from entering the rear surface. Still further, since the rear surface of the silicon film 12 including the monocrystalline silicon diaphragm 4 is in contact with the conductor 10, electrical conduction between the silicon film 12 and the conductor 10 may be easily attained (see Example 2 to be described below).

Figure 3A:
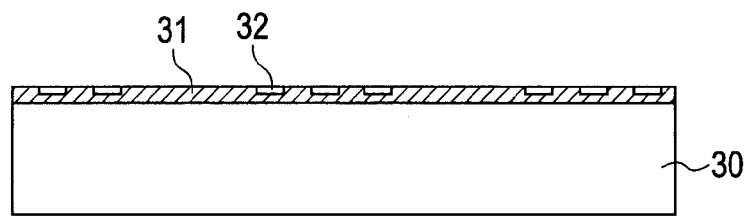
FIG. 3A, is a cross-sectional view illustrating a method of manufacturing a capacitive transducer array which is an electromechanical transducer of the present invention, according to an embodiment and Example 3.

A manufacturing method of this embodiment is now described with reference to FIGS. 3A to 3F. FIGS. 3A to 3F are sectional views of a manufacturing method of a capacitive transducer array having the structure substantially similar to that illustrated in FIGS. 1A to 1C. As illustrated in FIG. 3A, a first insulating layer 31 is formed on one surface of a first silicon substrate 30 which is a first semiconductor substrate, and a gap 32 is formed in the insulating layer 31. It is desired that the resistivity of the first silicon substrate 30 be on the order of 0.1 Ω·cm or smaller. In the case where the insulating layer 31 is directly bonded to a second silicon substrate 33 for forming a monocrystalline silicon diaphragm 43 in a process subsequent to this process, it is desired that the insulating layer 31 be a silicon oxide film formed by thermal oxidation. Direct bonding requires a substrate to be bonded to have high flatness, low surface roughness, and the like. A silicon oxide film formed by thermal oxidation has high flatness and does not increase the surface roughness of the substrate, which facilitates direct bonding. When the bonding is carried out with a resin or the like, the insulating layer may be formed of other materials. For example, an insulating layer of silicon nitride or the like may be used.

Figure 3B:
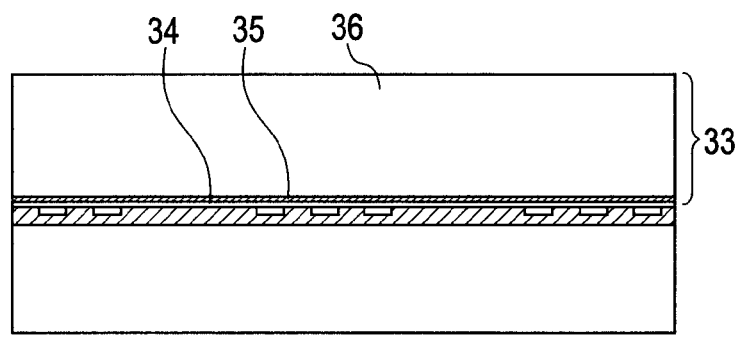
FIG. 3B is a cross-sectional view illustrating a method of manufacturing a capacitive transducer array which is an electromechanical transducer of the present invention, according to an embodiment and Example 3.

Then, as illustrated in FIG. 3B, the second silicon substrate 33 which is a second semiconductor substrate for forming the monocrystalline silicon diaphragm 43 is bonded onto the first insulating layer 31, and it is then thinned. It is desired that the thickness of a silicon film which is a semiconductor film for forming the monocrystalline silicon diaphragm 43 be several micrometers or smaller. Therefore, the second silicon substrate 33 is bonded using a resin or by direct bonding, and thinning thereof is carried out by etching, grinding, or chemical mechanical polishing (CMP). As illustrated in FIG. 3B, in this process, as the second silicon substrate 33 for forming the monocrystalline silicon diaphragm 43, a silicon-on-insulator (SOI) substrate may be used. The SOI substrate is a substrate in which a silicon oxide layer (buried oxide (BOX) layer) 35 is inserted between a silicon substrate (handle layer) 36 and a surface silicon layer (active layer) 34. When such an SOI substrate is used, the active layer in the SOI substrate may be used as the silicon film 34 including the monocrystalline silicon diaphragm 43. Thus, the active layer side may be bonded in this process. Since the active layer in the SOI substrate may be manufactured with small thickness fluctuations, the thickness fluctuations of the monocrystalline silicon diaphragm 43 may be reduced. Therefore, the spring constant fluctuations of the diaphragm of the capacitive transducer may be reduced, and hence, frequency fluctuations in transmission and reception may be reduced.

Thinning of the SOI substrate is carried out by removing the handle layer 36 and the BOX layer 35. The handle layer 36 may be removed by grinding, CMP, or etching. The BOX layer 35 may be removed by etching (dry etching or etching using hydrofluoric acid) of the oxide film. Wet etching such as etching using hydrofluoric acid may prevent the silicon from being etched. Therefore, thickness fluctuations of the monocrystalline silicon diaphragm 43 due to etching may be reduced, which is more desirable. When an SOI substrate is not used as the second silicon substrate 33 for forming the monocrystalline silicon diaphragm 43, the substrate may be thinned to have a thickness on the order of 2 μm by back-grinding or CMP.

Figure 3C:
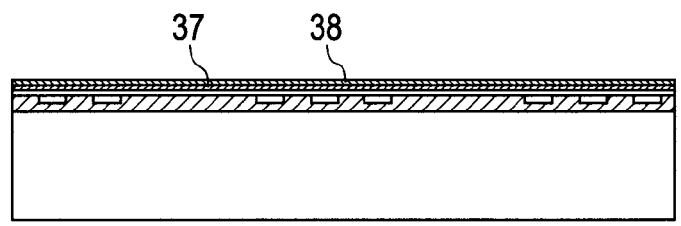
FIG. 3C is a cross-sectional view illustrating a method of manufacturing a capacitive transducer array which is an electromechanical transducer of the present invention, according to an embodiment and Example 3.
Figure 3D:
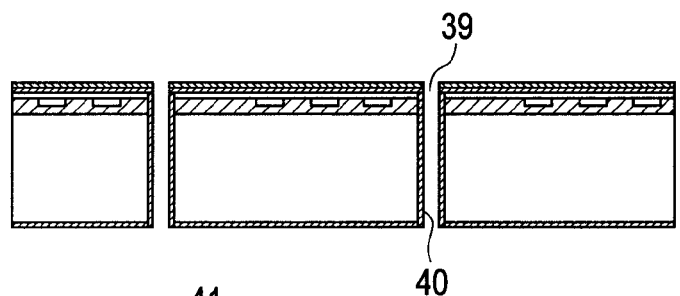
FIG. 3D is a cross-sectional view illustrating a method of manufacturing a capacitive transducer array which is an electromechanical transducer of the present invention, according to an embodiment and Example 3.
Figure 3E:
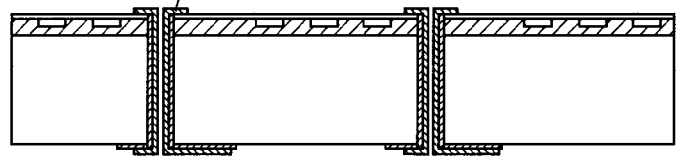
FIG. 3E is a cross-sectional view illustrating a method of manufacturing a capacitive transducer array which is an electromechanical transducer of the present invention, according to an embodiment and Example 3.

Then, as illustrated in FIG. 3C, a protective film 38 is formed on the silicon film 34 including the monocrystalline silicon diaphragm 43. In forming an insulating layer and a conductor to form through wiring in a process subsequent to this process, the protective film 38 prevents the insulating layer and the conductor from being in direct contact with the monocrystalline silicon diaphragm 43. Note that, the protective film 38 may be formed after a through hole 39 is formed. Then, as illustrated in FIG. 3D, the through hole 39 is formed and a second insulating layer 40 is formed. The through hole 39 is a path for taking wiring for electrical connection to the silicon film 34 including the monocrystalline silicon diaphragm 43 out to the rear surface side of the first silicon substrate 30. Further, as illustrated in FIG. 3E, the insulating layer 40 is for the purpose of insulating a conductor 41 (functioning as the wiring), which is electrically connected to the silicon film 34, from the first silicon substrate 30. In this process, as illustrated in FIG. 3C, the protective film 38 is formed before the insulating layer 40 is formed to prevent the insulating layer 40 or the conductor 41 from being directly deposited on the monocrystalline silicon diaphragm 43. Therefore, the insulating layer 40 or the conductor 41 is formed via the protective film 38 on the monocrystalline silicon diaphragm 43, and when the insulating layer 40 or the conductor 41 is removed in a process subsequent to this process, the removal may be carried out without subjecting the monocrystalline silicon diaphragm 43 to etching. However, when a metal or the like is used as the conductor 41, since such a material is more easily etched compared with polysilicon, the conductor 41 may be formed after the protective film 38 is removed. In this way, the manufacturing method according to this embodiment has a feature that the protective film 38 is formed on the silicon film 34 before the process of forming the insulating layer 40. Then, preferably, the process of removing the protective film 38 is carried out after the process of forming the conductor 41. It can prevent thickness fluctuations of the monocrystalline silicon diaphragm 43.

As this protective film 38, a silicon oxide film or a two-layer structure in which a silicon nitride film is formed on a silicon oxide film is desirable. When a silicon oxide film formed by thermal oxidation is used as the insulating layer, the monocrystalline silicon diaphragm 43 is oxidized to cause thickness fluctuations. A silicon oxide film formed by thermal oxidation is formed by oxidizing the surface of the silicon by about 40% of a desired film formation amount. Therefore, it is preferred that a silicon nitride film, which is a material having a characteristics of not being thermally oxidized, be used as the protective film 38. Further, when a film formed on the monocrystalline silicon diaphragm 43 is removed, if the monocrystalline silicon diaphragm 43 is etched, it may cause thickness fluctuations, which results in spring constant fluctuations and deformation fluctuations of the diaphragm 43. It follows that wet etching using hydrofluoric acid or the like with which the monocrystalline silicon diaphragm 43 is not etched is desirable. Therefore, it is desired that a silicon oxide film be formed directly on the monocrystalline silicon diaphragm 43. It enables formation of the diaphragm 43 without causing thickness fluctuations of the monocrystalline silicon diaphragm 43.

It is preferred that the through hole 39 have little level difference on the side wall thereof. When there is a level difference on the side wall of the through hole 39, short circuit and disconnection are liable to occur when the insulating layer 40 and the conductor 41 are formed. Therefore, it is desired that the insulating layer 40 and the side wall of the through hole 39 have little level difference. Further, the through hole 39 may be formed as a tapered structure for the purpose of easy formation of the insulating layer 40 and the conductor 41 in the through hole 39. In particular, by adopting the tapering structure in which the diameter of the through hole 39 on the silicon substrate 30 side at which the electrode is taken out is larger than the diameter thereof on the silicon film 34 side, the number of the cellular structures in an element can be increased.

Further, as the insulating layer 40, a silicon oxide film formed by thermal oxidation or a TEOS film is desirable. Those films are easily formed uniformly on the side wall of the through hole 39 and an insulating layer having a thickness of 1 μm or larger can be formed with ease. By adopting this material, short circuit between the conductor 41 and the silicon substrate 30 and disconnection in the conductor 41 can be prevented easily, and also the parasitic capacitance between the conductor 41 and the first silicon substrate 30 can be reduced. Thus, the transmission and reception performance may be prevented from being deteriorated.

Then, as illustrated in FIG. 3E, only a contact portion of the protective film 38 for electrical connection between the silicon film 34 and the conductor 41 is etched and the conductor 41 is formed on the insulating layer 40 provided on a front surface side of the first silicon substrate 30, in the through hole 39, and on the rear surface of the first silicon substrate 30. After that, the conductor 41, the insulating layer 40, and the protective film 38 which are deposited on the silicon film 34 including the monocrystalline silicon diaphragm 43 and a part of the insulating layer 40 and the conductor 41 on the rear surface of the first silicon substrate 30 are removed by etching. As described above, this may expose the monocrystalline silicon diaphragm 43 without causing thickness fluctuations in the monocrystalline silicon diaphragm 43 and stress thereon. However, the present invention is not limited to establishment of electrical connection between the silicon film 34 and the conductor 41 by etching the protective film 38 at the contact portion. For example, when the conductor 41 is formed in the through hole 39, after the conductor 41 is formed on the protective film 38, the silicon film 34 and a wiring portion of the conductor 41 may be brought into contact by removing the conductor 41, the insulating layer 40, and the protective film 38 on the diaphragm 43 and providing again a conductor such as Al on the diaphragm 43.

Figure 3F:
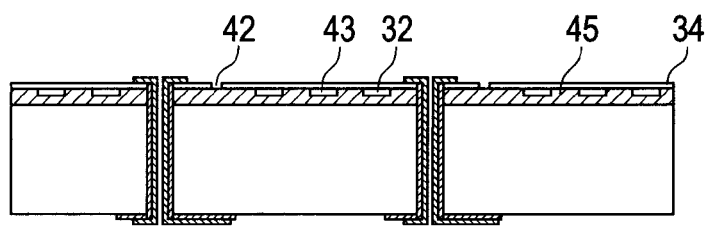
FIG. 3F is a cross-sectional view illustrating a method of manufacturing a capacitive transducer array which is an electromechanical transducer of the present invention, according to an embodiment and Example 3.

Then, as illustrated in FIG. 3F, the silicon film 34 is divided at separating locations 42. Thus the multiple elements can be electrically separated from one another. In a capacitive transducer array manufactured by this manufacturing method, the thickness fluctuations and the spring constant fluctuations of the monocrystalline silicon diaphragm 43 may be easily reduced to have only small performance fluctuations. Further, since a 2D (two-dimensional) array is formed with the through wiring without dividing the silicon substrate 30, a capacitive transducer array can be manufactured without lowering the stiffness. In the cellular structure manufactured in this way, the monocrystalline silicon diaphragm 43 over the gap 32 is vibratably supported by a diaphragm supporting portion 45.

Figure 4A:
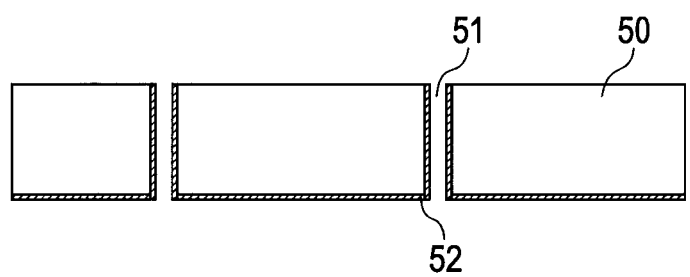
FIG. 4A is a cross-sectional view illustrating a method of manufacturing a capacitive transducer array which is an electromechanical transducer of the present invention, according to another embodiment and Example 4.

A manufacturing method of another embodiment is now described with reference to FIGS. 4A to 4E. FIGS. 4A to 4E are sectional views of a manufacturing method of a capacitive transducer array having the configuration substantially similar to that illustrated in FIGS. 1A to 1C. In this embodiment, as illustrated in FIG. 4A, a through hole 51 is formed in a first silicon substrate 50 which is the first semiconductor substrate, and a second insulating layer 52 is formed therein. Since a second silicon substrate 55 which is the second semiconductor substrate for forming a monocrystalline silicon diaphragm 61 that is a semiconductor film is bonded to a front surface side of the first silicon substrate 50, the surface is required to maintain its flatness. Therefore, before the through hole 51 is formed, a protective film (not shown) is formed on the silicon substrate 50. After that, the through hole 51 is formed, the second insulating layer 52 is formed, and the insulating layer 52 and the protective film on the front surface of the first silicon substrate 50 are removed. Thus the structure illustrated in FIG. 4A can be manufactured without increasing the surface roughness of the first silicon substrate 50, and the second silicon substrate 55 can be bonded thereto with ease.

As described above, as the insulating layer 52, a silicon oxide film formed by thermal oxidation or a TEOS film is desirable. Further, as the protective film, a silicon oxide film or a two-layer structure in which a silicon nitride film is formed on a silicon oxide film is desirable. When a silicon oxide film formed by thermal oxidation is used as the insulating layer 52, the first silicon substrate 50 would be oxidized to increase the surface roughness. Therefore, it is preferred that a silicon nitride film, which is a material having a characteristics of not being thermally oxidized, be used as the protective film. Still further, when the insulating layer 52 formed on the first silicon substrate 50 is removed by etching, if the first silicon substrate 50 is etched to increase the surface roughness, bonding failure is liable to occur. It follows that wet etching using hydrofluoric acid or the like with which the first silicon substrate 50 is not etched is desirable. Therefore, it is desired that a silicon oxide film be formed directly on the silicon substrate 50.

Figure 4B:
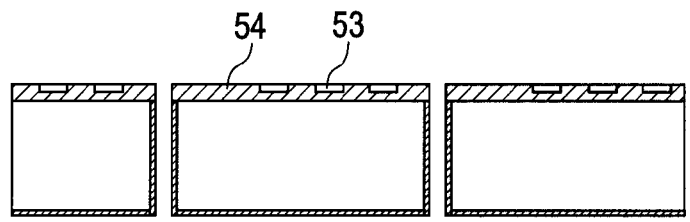
FIG. 4B is a cross-sectional view illustrating a method of manufacturing a capacitive transducer array which is an electromechanical transducer of the present invention, according to another embodiment and Example 4.
Figure 4C:
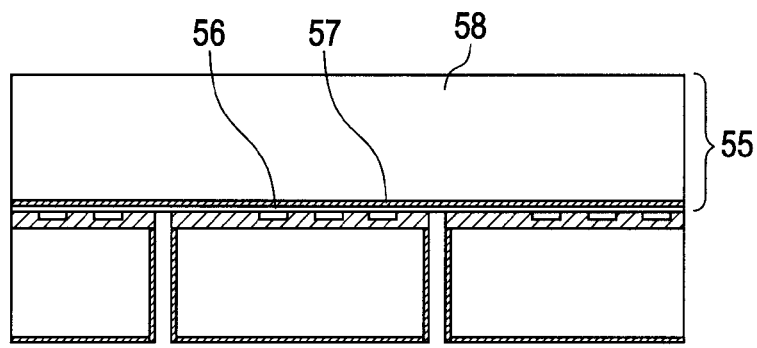
FIG. 4C is a cross-sectional view illustrating a method of manufacturing a capacitive transducer array which is an electromechanical transducer of the present invention, according to another embodiment and Example 4.
Figure 4D:
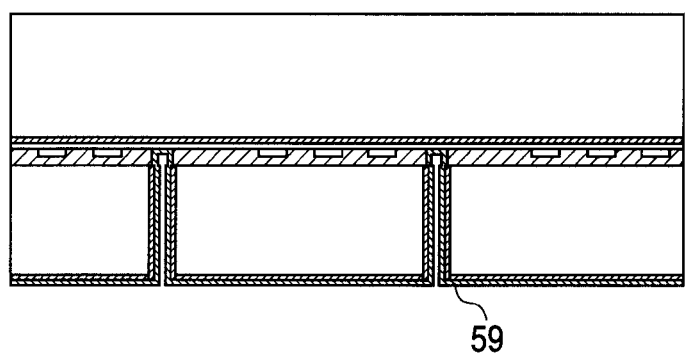
FIG. 4D is a cross-sectional view illustrating a method of manufacturing a capacitive transducer array which is an electromechanical transducer of the present invention, according to another embodiment and Example 4.
Figure 4E:
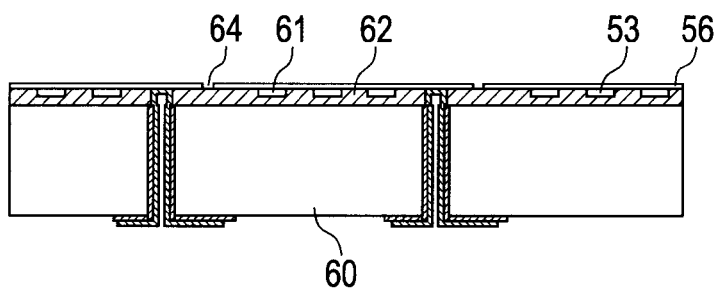
FIG. 4E is a cross-sectional view illustrating a method of manufacturing a capacitive transducer array which is an electromechanical transducer of the present invention, according to another embodiment and Example 4.

Further, in this process, the insulating layer 52 formed on a rear surface of the first silicon substrate 50 can be patterned and divided (see FIG. 4E and FIG. 1C). Thus deformation of the first silicon substrate 50 before the bonding can be reduced, which facilitates the bonding and prevents bonding failure.

Then, as illustrated in FIG. 4B, a first insulating layer 54 is formed on one surface of the first silicon substrate 50, and a gap 53 is formed therein. After that, as illustrated in FIG. 4C, the second silicon substrate 55 for forming the monocrystalline silicon diaphragm 61 is bonded onto the first insulating layer 54. As described above, the bonding in this process may be direct bonding and may be bonding using a resin or the like. If the through hole 51 and the insulating layer 54 are formed after the bonding, the insulating layer 54 is formed also on a lower surface of a silicon film 56 including the monocrystalline silicon diaphragm 61, and it is difficult to establish electrical connection between a conductor 59 and the silicon film 56 including the monocrystalline silicon diaphragm 61. By carrying out the bonding after the through hole 51 and the insulating layer 54 are formed, as exemplified in this manufacturing method, electrical connection between the silicon film 56 including the monocrystalline silicon diaphragm 61 and the conductor 59 may be easily established.

Then, as illustrated in FIG. 4D, the conductor 59 is formed. By the formation of the conductor 59 in this process, an electrical signal received from the silicon film 56 including the monocrystalline silicon diaphragm 61 can be taken out via the through hole 51 to the rear surface of the first silicon substrate 50. Further, since a rear surface of the silicon film 56 including the monocrystalline silicon diaphragm 61 is in contact with the conductor 59, electrical conduction between the silicon film 56 and the conductor 59 can be easily attained.

Further, as illustrated in FIG. 4E, the second silicon substrate 55 for forming the monocrystalline silicon diaphragm 61 is thinned. As described above, the thinning is carried out by etching, grinding, CMP, or the like, to thereby pattern the rear surface. Further, as described above, the thinning may also be carried out by removing a handle layer 58 and a BOX layer 57 of an SOI substrate. Next, the silicon film 56 including the monocrystalline silicon diaphragm 61 is divided at separating locations 64. Thus, the elements can be electrically separated from one another.

It is desired that the thinning of the second silicon substrate 55 be carried out at the end of the process of manufacturing the capacitive transducer. The reason is that since the monocrystalline silicon diaphragm 61 has a thickness on the order of 1 μm, if a process which requires heating or a process of processing a surface of the silicon substrate 50 that is opposite to the surface having the monocrystalline silicon diaphragm 61 is carried out after the second silicon substrate 55 is thinned, the monocrystalline silicon diaphragm 61 can be broken. According to this method of manufacturing a capacitive transducer array, there is no process in which thermal hysteresis is added or in which the rear surface of the silicon substrate 50 is processed after the process of thinning the second silicon substrate 55. Therefore, the monocrystalline silicon diaphragm 61 is less liable to be broken, and reduction of manufacturing yield of the capacitive transducer array may be prevented.

The manufacturing method described above has a feature in that the through hole 51 is formed in the first silicon substrate 50 before the second semiconductor substrate is bonded thereto. Further, before the process of forming the gap 53, the through hole 51 is formed in the first silicon substrate 50 and the second insulating layer 52 is formed on the opposite surface of the first silicon substrate 50 and on the side wall of the through hole 51. Further, after the bonding process, the conductor 59 is formed and the conductor 59 is electrically connected to the silicon film 56 from the opposite surface of the first silicon substrate 50. In other words, the insulating layer 52 and the conductor 59 are formed in the state in which the monocrystalline silicon diaphragm 61 is not exposed.

Therefore, a capacitive transducer array which reduces the thickness fluctuations and the spring constant fluctuations in the monocrystalline silicon diaphragm 61 and has only small performance fluctuations may be easily manufactured. Further, since a through hole is not formed in the front surface of the capacitive transducer, when the capacitive transducer is used in a liquid, the liquid may be prevented from entering the rear surface.

In the following, the present invention is described in detail by more specific examples.

Example 1

A configuration of a capacitive transducer array of Example 1 is described with reference to FIGS. 1A to 1C used in describing the above-mentioned first embodiment. In this example, too, the capacitive transducer array includes multiple elements 3 each including multiple cellular structures 1 and through wiring 2. In FIG. 1A, only four of the elements 3 are illustrated, but arbitrary number of the elements 3 may be arranged.

The cellular structure 1 includes a monocrystalline silicon diaphragm 4 having a thickness of 1 μm, a gap 5, a diaphragm supporting portion 6 for supporting the monocrystalline silicon diaphragm 4 having a resistivity of 0.01 Ω·cm, and a silicon substrate 7. The silicon substrate 7 has a thickness of 300 μm and a resistivity of 0.01 Ω·cm. The cellular structure 1 illustrated in FIGS. 1A to 1C is in the shape of a circle, but may be in the shape of a square, a hexagon, or the like. A main material of the monocrystalline silicon diaphragm 4 is monocrystalline silicon, and no layer having large residual stress is formed thereon, and thus, the capacitive transducer has high consistency among the elements 3 and may reduce transmission and reception performance fluctuations. In order to improve the conduction characteristics of the monocrystalline silicon diaphragm 4, a thin aluminum film having a thickness on the order of 200 nm may be formed. In this configuration, the monocrystalline silicon diaphragm 4 is in the shape of a circle with the diameter of 30 μm.

The diaphragm supporting portion 6 is formed of silicon oxide and has a height of 500 nm. The amount of the gap 5 is 200 nm. The through wiring 2 includes a through hole 8, a conductor 10, and an insulating layer 9 for insulating the side wall of the through hole 8 and a part of the silicon substrate 7 from the conductor 10. The insulating layer 9 is a silicon oxide film having a thickness of 1 μm. The conductor 10 is polysilicon doped with impurities and has a thickness of 2 μm. The through hole 8 with the diameter of 20 μm seamlessly extends from a silicon film 12 including the monocrystalline silicon diaphragm 4 to the rear surface of the silicon substrate 7, and has a substantially vertical shape which is formed by silicon deep etching. The through hole 8 may be completely backfilled with an insulator or a conductor. When the through hole 8 is not completely backfilled, there is an air gap in the through hole 8. Even when the through hole 8 is completely backfilled, there may remain an air gap in the through hole 8. When ultrasound is transmitted or received, the ultrasound may be reflected by the air gap and noise may be caused. However, the through hole 8 is not provided immediately below the cellular structure 1, and thus, even when there is an air gap in the through hole 8, sensitivity lowering due to noise may be prevented.

The elements 3 are electrically separated from one another at separating locations 11. Electrically separating grooves are formed by dry etching the silicon film 12 including the monocrystalline silicon diaphragm 4 at the separating locations 11. A metal (not shown) is formed on the rear surface of the silicon substrate 7 in order to promote ohmic behavior of the silicon substrate 7 which is to be the common electrode for the multiple elements 3. The structure of the metal is, for example, a lamination structure of titanium/platinum/gold. Similarly, a metal (not shown) is formed also on the conductor 10 forming the through wiring 2 on the rear surface side of the silicon substrate 7.

Reception and transmission of ultrasound of the capacitive transducer array of this example is as described above. When the capacitive transducer array of this configuration is used in a material which has the acoustic impedance similar to that in a liquid, the center frequency is on the order of 7 MHz. The 3 dB frequency band (frequency band which exhibits an intensity that is lower than the peak intensity by about 3 dB or lower) is about 2.5 MHz to 11.5 MHz, and wide-band characteristics may be obtained.

In this example, the silicon film 12 including the monocrystalline silicon diaphragm 4 may be divided to electrically separate the elements 3 from one another, and the silicon substrate 7 may be used as the common electrode. This configuration may enhance the stiffness of the capacitive transducer array, and the capacitive transducer may be prevented from being broken even if stress is applied thereto when being mounted or the like. Further, in this configuration, the monocrystalline silicon diaphragm 4 is taken out to the rear surface via the vertical through wiring 2, and thus, short circuit and disconnection due to level difference or the like caused when the insulating layer 9 or the conductor 10 forming the through wiring 2 is formed may be prevented.

Further, as illustrated in FIG. 1C, the insulating layer 9 formed on the rear surface of the silicon substrate 7 is not formed all over the rear surface but is divided. Therefore, deformation of the whole silicon substrate 7 due to stress produced by the insulating layer 9 may be prevented. If the whole silicon substrate 7 is deformed, it is difficult to bond the silicon film 12 including the monocrystalline silicon diaphragm 4, and thus, bonding failure is liable to occur. Therefore, this configuration may reduce such bonding failure. Further, deformation fluctuations among the elements 3 may be reduced as well, and thus, fluctuations in the distance between an object to be measured and the element 3 may be reduced in the respective elements 3 in receiving ultrasound. Further, fluctuations in focal position of ultrasound generated from the respective elements 3 in transmission may be reduced.

Example 2

A configuration of a capacitive transducer array of Example 2 is described with reference to FIG. 2. FIG. 2 is a sectional view of the capacitive ultrasound transducer array of this example. The configuration of Example 2 is substantially similar to that of Example 1.

A cellular structure 1 includes a monocrystalline silicon diaphragm 4 having a thickness of 1 μm, a gap 5, a diaphragm supporting portion 6 for supporting the monocrystalline silicon diaphragm 4, and a silicon substrate 7. The silicon substrate 7 has a thickness of 300 μm and a resistivity of 0.01 Ω·cm. In this configuration, the cellular structure 1 is in the shape of a circle with the diameter of 40 μm. The diaphragm supporting portion 6 is formed of silicon oxide and has a height of 400 nm. The amount of the gap 5 is 200 nm. The through wiring 2 includes a through hole 8, a conductor 10, and an insulating layer 9 for insulating the side wall of the through hole 8 and a part of the silicon substrate 7 from the conductor 10. The insulating layer 9 is a silicon oxide film formed of a TEOS film and has a thickness of 1 μm. The conductor 10 is polysilicon doped with impurities. The conductor 10 can also be a metal such as copper. The through hole 8 seamlessly extends from the rear surface of a silicon film 12 including the monocrystalline silicon diaphragm 4 to the rear surface of the silicon substrate 7, and has a substantially vertical shape which is formed by silicon deep etching.

In this example, the conductor 10 is connected on the rear surface of the monocrystalline silicon diaphragm 4. In this configuration, a through hole is not formed on the element 3 side, and thus, when the capacitive transducer array is used in a liquid or the like, the liquid may be prevented from entering the rear surface. Further, the rear surface of the silicon film 12 including the monocrystalline silicon diaphragm 4 is in contact with the conductor 10, and thus, electrical conduction between the monocrystalline silicon diaphragm 4 and the conductor 10 may be easily attained.

Example 3

A method of manufacturing a capacitive transducer array of Example 3 is described with reference to FIGS. 3A to 3F used in describing the above-mentioned first embodiment. As illustrated in FIG. 3A, an insulating layer 31 which is silicon oxide is formed by thermal oxidation on a first silicon substrate 30 having a thickness of 300 μm, and a gap 32 is formed by photolithography or etching. The resistivity of the first silicon substrate 30 is on the order of 0.01 Ω·cm.

Then, as illustrated in FIG. 3B, a second silicon substrate 33 is bonded and thinned. Here, the second silicon substrate 33 is an SOI substrate. In the SOI substrate, an active layer 34 has a thickness of 1 μm, a BOX layer 35 has a thickness of 0.4 μm, and a handle layer 36 has a thickness of 525 μm. The active layer 34 in the SOI substrate has a resistivity of 0.1 Ω·cm. The active layer 34 having thickness fluctuations of ±5% or less is used, and the active layer side is directly bonded. The active layer in the SOI substrate 33 has small thickness fluctuations, and thus, the thickness fluctuations of a monocrystalline silicon diaphragm 43 may be reduced. Therefore, the spring constant fluctuations in the diaphragm of the capacitive transducer may be reduced. Thinning of the SOI substrate is carried out by removing the handle layer 36. The handle layer may be removed by backgrinding or alkaline etching.

Then, as illustrated in FIG. 3C, a protective film is formed on a silicon film 34 including the monocrystalline silicon diaphragm 43. The BOX layer 35 in the SOI substrate is used as the protective film and a silicon nitride film 38 is formed thereon. In a process subsequent to this process, when an insulating layer 40 and a conductor 41 are formed, the protective film prevents the insulating layer and the conductor from being in direct contact with the monocrystalline silicon diaphragm 43.

Then, as illustrated in FIG. 3D, a through hole 39 having a diameter of 20 μm is formed by silicon deep etching, and an oxide film is formed as the insulating layer 40 by thermal oxidation. In this process, as illustrated in FIG. 3C, since the protective films 37 and 38 are formed before the through hole 39 is formed and then forming the through hole 39, the insulating layer 40 or the conductor 41 is not directly deposited on the monocrystalline silicon diaphragm 43. Hence, the insulating layer 40 or the conductor 41 is formed on the monocrystalline silicon diaphragm 43 via the protective films 37 and 38. When the insulating layer 40 and the conductor 41 are removed in a process subsequent to this process, the removal may be carried out without etching the monocrystalline silicon diaphragm 43. Hence, thickness fluctuations of the monocrystalline silicon diaphragm 43 may be prevented. It is preferred that the through hole 39 have little level difference on the side wall thereof. If there is a level difference on the side wall of the through hole 39, short circuit and disconnection are liable to occur when the insulating layer 40 and the conductor 41 are formed. In this example, the through hole 39 is vertical and has little level difference on the side wall thereof.

Then, as illustrated in FIG. 3E, only the contact portion of the protective film for electrical connection between the silicon film 34 and the conductor 41 is etched, and the conductor 41 which is polysilicon doped with impurities is formed. After that, the conductor 41 (excluding a region at the contact portion), the insulating layer 40, and the protective film 38 which are deposited on the silicon film 34 including the monocrystalline silicon diaphragm 43 are removed. The conductor 41, the insulating layer 40, and the protective film 38 which is a silicon nitride film are removed by dry etching while the protective film 37 which is a BOX layer (silicon oxide) is removed using hydrofluoric acid. This may expose the monocrystalline silicon diaphragm 43 without increasing the thickness fluctuations of the monocrystalline silicon diaphragm 43.

Then, as illustrated in FIG. 3F, the silicon film 34 including the monocrystalline silicon diaphragm 43 is divided at separating locations 42. This may electrically separate the respective elements from one another. In a capacitive transducer array manufactured using this manufacturing method, the thickness fluctuations and the spring constant fluctuations of the monocrystalline silicon diaphragm 43 may be reduced to have only small performance fluctuations with each.

Example 4

A method of manufacturing a capacitive transducer array of Example 4 is described with reference to FIGS. 4A to 4E used in describing the above-mentioned second embodiment. As illustrated in FIG. 4A, a through hole 51 is formed in a first silicon substrate 50 by silicon deep etching, and an insulating layer 52 which is silicon oxide is formed by thermal oxidation. The first silicon substrate 50 has a thickness of 300 µm and a resistivity of 0.01 Ω·cm. Since a second silicon substrate 55 for forming a monocrystalline silicon diaphragm 61 is directly bonded to a front surface side of the first silicon substrate 50, the surface is required to maintain its flatness. Before the through hole 51 is formed, a protective film (not shown) which is silicon oxide is formed on the silicon substrate 50 at a thickness of 0.1 µm by thermal oxidation, and silicon nitride is formed thereon at a thickness of 0.2 µm. A silicon oxide film formed by thermal oxidation does not increase the surface roughness of the first silicon substrate 50. After that, the through hole 51 is formed, the insulating layer 52 which is a silicon oxide film is formed at a thickness of 1 µm by thermal oxidation, and the insulating layer 52 and the protective film on the front surface of the silicon substrate 50 are removed. This enables manufacture of the structure illustrated in FIG. 4A while maintaining the surface roughness Rms of 0.2 nm or smaller and not increasing the surface roughness of the first silicon substrate 50. Therefore, another substrate may be easily bonded, and reduction of manufacturing yield due to bonding failure may be prevented.

Then, as illustrated in FIG. 4B, an insulating layer 54 which is silicon oxide is formed by thermal oxidation on the first silicon substrate 50, and a gap 53 is formed. The insulating layer 54 has a thickness of 400 nm, and the amount of the gap 53 is 200 nm. After that, as illustrated in FIG. 4C, the second silicon substrate 55 for forming the monocrystalline silicon diaphragm 61 is bonded. The second silicon substrate 55 is an SOI substrate in which an active layer 56 has a thickness of 1 µm, a BOX layer 57 has a thickness of 0.4 µm, and a handle layer 58 has a thickness of 525 µm.

Then, as illustrated in FIG. 4D, a conductor 59 which is polysilicon doped with impurities is formed. The polysilicon has a thickness of 2 µm. In this process, the rear surface of the silicon film 56 including the monocrystalline silicon diaphragm 61 and the conductor 59 may be directly connected to each other. Therefore, an electrical signal may be taken out from the rear surface of the silicon film 56 including the monocrystalline silicon diaphragm 61 via the through hole 51 to the rear surface of the silicon substrate 50.

Further, as illustrated in FIG. 4E, the SOI substrate 55 is thinned. The handle layer 58 is removed by backgrinding or wet etching using an alkali solution. Further, the BOX layer 57 is removed using hydrofluoric acid. Next, the silicon film 56 including the monocrystalline silicon diaphragm 61 is divided at separating locations 64. This may electrically separate the elements from one another. In the cellular structure manufactured in this way, the monocrystalline silicon diaphragm 61 over the gap 53 is vibratably supported by a diaphragm supporting portion 62. Further, the insulating layer 52 and the conductor 59 are removed at a portion 60 of the rear surface of the silicon substrate 50.

By each of the manufacturing methods described above, a capacitive transducer array which reduces the thickness fluctuations and the spring constant fluctuations of the monocrystalline silicon diaphragm and has only small performance fluctuations may be manufactured with ease. Further, a through hole is not formed in the front surface of the capacitive transducer, and thus, when the capacitive transducer is used in a liquid, the liquid may be prevented from entering the rear surface. Further, the rear surface of the silicon film 56 including the monocrystalline silicon diaphragm 61 is in contact with the conductor 59, and thus, electrical conduction between the silicon film 56 including the monocrystalline silicon diaphragm 61 and the conductor 59 may be easily attained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:
1. A method of manufacturing an electromechanical transducer, comprising:
  forming a through hole in a first semiconductor substrate;
  forming a first insulating layer on a first surface of the first semiconductor substrate and forming a concave portion in the first insulating layer;
  bonding a second semiconductor substrate including a semiconductor film to the first insulating layer so as to form a gap between the first surface and the second semiconductor substrate;
  forming a second insulating layer on a side wall of the through hole;
  forming a conductor on the second insulating layer;
  thinning the second semiconductor substrate; and
  dividing the semiconductor film for each of multiple elements,
  wherein, before the bonding of the second semiconductor substrate, the through hole and the second insulating layer are formed, and
  wherein, after the bonding of the second semiconductor substrate, the conductor is formed, wherein, before the forming of the through hole, a protective film is formed on the first surface of the first semiconductor substrate, and wherein, after the forming of the through hole and before the forming of the first insulating layer, the protective film is removed.

2. The method of manufacturing an electromechanical transducer according to claim 1, wherein, before the forming of the concave portion, the second insulating layer is formed.

3. The method of manufacturing an electromechanical transducer according to claim 1, wherein the conductor is formed such that the conductor is connected to the semiconductor film in the second semiconductor substrate.

4. The method of manufacturing an electromechanical transducer according to claim 1, wherein the first semiconductor substrate comprises a silicon substrate.

5. The method of manufacturing an electromechanical transducer according to claim 4, wherein the silicon substrate is thermally oxidized to form the first insulating layer comprising a silicon oxide film.

6. The method of manufacturing an electromechanical transducer according to claim 4, wherein the silicon substrate is thermally oxidized to form the second insulating layer comprising a silicon oxide film.

7. The method of manufacturing an electromechanical transducer according to claim 1, wherein the second semiconductor substrate including the semiconductor film comprises an SOI substrate including a monocrystalline silicon diaphragm and the second semiconductor substrate is thinned to the monocrystalline silicon diaphragm.

8. The method of manufacturing an electromechanical transducer according to claim 1, wherein, after the forming of the through hole, a surface roughness Rms of the first surface of the first substrate is 0.2 nm or smaller.

9. The method of manufacturing an electromechanical transducer according to claim 1, wherein the protective film comprises a silicon oxide film and silicon nitride.

10. The method of manufacturing an electromechanical transducer according to claim 1, wherein, in the forming of the second insulating layer, the second insulating layer is formed on a second surface of the first semiconductor substrate, the second surface opposing to the first surface of the first semiconductor substrate wherein, after the forming of the conductor, a part of the second insulating layer formed on the second surface of the first semiconductor substrate is removed.

11. A method of manufacturing an electromechanical transducer, comprising:
forming a through hole in a first semiconductor substrate;
forming a first insulating layer on a first surface of the first semiconductor substrate and forming a concave portion in the first insulating layer;
bonding a second semiconductor substrate including a semiconductor film to the first insulating layer so as to form a gap between the first surface and the second semiconductor substrate;
forming a second insulating layer on a side wall of the through hole;
forming a conductor on the second insulating layer on a side wall of the through hole;
thinning the second semiconductor substrate; and
dividing the semiconductor film for each of multiple elements,
wherein, before the bonding of the second semiconductor substrate, the through hole and the second insulating layer are formed, and wherein, after the bonding of the second semiconductor substrate, the conductor is formed on the second insulating layer which is formed on a side wall of the through hole.

12. The method of manufacturing an electromechanical transducer according to claim 11, wherein, before the forming of the concave portion, the second insulating layer is formed.

13. The method of manufacturing an electromechanical transducer according to claim 11, wherein the conductor is formed such that the conductor is connected to the semiconductor film in the second semiconductor substrate.

14. The method of manufacturing an electromechanical transducer according to claim 11, wherein the first semiconductor substrate comprises a silicon substrate.

15. The method of manufacturing an electromechanical transducer according to claim 14, wherein the silicon substrate is thermally oxidized to form the first insulating layer comprising a silicon oxide film.

16. The method of manufacturing an electromechanical transducer according to claim 14, wherein the silicon substrate is thermally oxidized to form the second insulating layer comprising a silicon oxide film.

17. The method of manufacturing an electromechanical transducer according to claim 11, wherein the second semiconductor substrate including the semiconductor film comprises an SOI substrate including a monocrystalline silicon diaphragm and the second semiconductor substrate is thinned to the monocrystalline silicon diaphragm.

18. The method of manufacturing an electromechanical transducer according to claim 11, wherein, after the forming of the through hole, a surface roughness Rms of the first surface of the first substrate is 0.2 nm or smaller.

19. The method of manufacturing an electromechanical transducer according to claim 11, wherein, in the forming of the second insulating layer, the second insulating layer is formed on a second surface of the first semiconductor substrate, the second surface opposing to the first surface of the first semiconductor substrate, wherein, after the forming of the conductor, a part of the second insulating layer formed on the second surface of the first semiconductor substrate is removed.

20. A method of manufacturing an electromechanical transducer, comprising:
forming a through hole in a first semiconductor substrate;
forming a first insulating layer on a first surface of the first semiconductor substrate and forming a concave portion in the first insulating layer;
bonding a second semiconductor substrate including a semiconductor film to the first insulating layer so as to form a gap between the first surface and the second semiconductor substrate;
forming a second insulating layer on a side wall of the through hole;
forming a conductor on the second insulating layer on a side wall of the through hole;
thinning the second semiconductor substrate; and
dividing the semiconductor film for each of multiple elements,
wherein, before the bonding of the second semiconductor substrate, the through hole and the second insulating layer are formed, and
wherein, after the forming of the through hole, a surface roughness Rms of the first surface of the first substrate is 0.2 nm or smaller.

* * * * *